United States Patent
Gopal et al.

(10) Patent No.: US 9,917,596 B2
(45) Date of Patent: Mar. 13, 2018

(54) TECHNOLOGIES FOR EFFICIENT LZ77-BASED DATA DECOMPRESSION

(71) Applicant: Intel Corporation, Santa Clara, CA (US)

(72) Inventors: Vinodh Gopal, Westborough, MA (US); Sean M. Gulley, Boston, MA (US); James D. Guilford, Northborough, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/374,462

(22) Filed: Dec. 9, 2016

(65) Prior Publication Data

US 2017/0250706 A1    Aug. 31, 2017

Related U.S. Application Data

(63) Continuation of application No. 14/494,766, filed on Sep. 24, 2014, now Pat. No. 9,524,169.

(51) Int. Cl.
*H03M 7/34* (2006.01)
*H03M 7/30* (2006.01)
*G06F 3/06* (2006.01)

(52) U.S. Cl.
CPC ........ *H03M 7/3086* (2013.01); *G06F 3/0604* (2013.01); *G06F 3/064* (2013.01);
(Continued)

(58) Field of Classification Search
CPC ............. H03M 7/3086; H03M 7/6017; H03M 7/3091; H03M 7/6005; G06F 3/0604;
(Continued)

(56) References Cited

U.S. PATENT DOCUMENTS

| 7,233,265 B2 * | 6/2007 | Cockburn | H03M 7/3086 341/106 |
| 8,766,827 B1 * | 7/2014 | Milne | H03M 7/3084 341/51 |

(Continued)

FOREIGN PATENT DOCUMENTS

WO    2013-082990    6/2013

OTHER PUBLICATIONS

International Search Report for PCT application No. PCT/US2015/046540, dated Feb. 23, 2016 (3 pages).
(Continued)

*Primary Examiner* — Brian Young
(74) *Attorney, Agent, or Firm* — Barnes & Thornburg LLP

(57) ABSTRACT

Technologies for data decompression include a computing device that reads a symbol tag byte from an input stream. The computing device determines whether the symbol can be decoded using a fast-path routine, and if not, executes a slow-path routine to decompress the symbol. The slow-path routine may include data-dependent branch instructions that may be unpredictable using branch prediction hardware. For the fast-path routine, the computing device determines a next symbol increment value, a literal increment value, a data length, and an offset based on the tag byte, without executing an unpredictable branch instruction. The computing device sets a source pointer to either literal data or reference data as a function of the tag byte, without executing an unpredictable branch instruction. The computing device may set the source pointer using a conditional move instruction. The computing device copies the data and processes remaining symbols. Other embodiments are described and claimed.

20 Claims, 6 Drawing Sheets

(52) U.S. Cl.
CPC ............ *G06F 3/065* (2013.01); *G06F 3/0673*
(2013.01); *H03M 7/3091* (2013.01); *H03M*
*7/6005* (2013.01); *H03M 7/6017* (2013.01)

(58) Field of Classification Search
CPC ........ G06F 3/065; G06F 3/0673; G06F 3/064;
G06F 3/067
USPC .................................................... 341/51, 87
See application file for complete search history.

(56) References Cited

U.S. PATENT DOCUMENTS

| | | |
|---|---|---|
| 9,515,678 B1 * | 12/2016 | Henry ................. H03M 7/3086 |
| 9,524,169 B2 * | 12/2016 | Gopal ................... G06F 9/3818 |
| 2007/0002780 A1 | 1/2007 | Pessi |
| 2009/0058693 A1 | 3/2009 | Laker et al. |
| 2010/0141488 A1 | 6/2010 | Baktir et al. |
| 2011/0154169 A1 | 6/2011 | Gopal et al. |

OTHER PUBLICATIONS

Written Opinion for PCT application No. PCT/US2015/046540, dated Feb. 23, 2016 (5 pages).

* cited by examiner

```
// Initialize in_ptr, out_ptr to input and output streams while (in_ptr < in_max && out_ptr < out_max) {
        tag = in_ptr[0];         306' if (tag >= 60*4) {                                         308', 310'
                go-to slower-code; // for the large literals,
                                  // but also covers other cases
        } class = tag & 0x3;          312'            314', 310' if (class == '11') {
                go-to slower-code; // very rare, can be branch
        }

// store amount to increment ptr for next tag
        tag_index = next_symbol_increment_table[tag];    316'

// store amount to increment ptr for literal copy src pointer
        lit_index = literal_increment_table[tag];      318'

// store length biased properly
        len = length_table[tag];            320' next_ptr = in_ptr + tag_index;     322'
        tag >>= 5;
        lit_ptr = in_ptr + lit_index;      324'

// For 2-byte offset, conditionally move 2nd byte of offset
        tag = ((class == '10') ? in_ptr[2] : tag);         326'
        offset = tag || in_ptr[1];        328'                     330'

// Conditionally move literal or offset pointer to src_ptr
        src_ptr = ((class == '00') ? lit_ptr : (out_ptr - offset));

if ((offset < 16) && (class != '00')) {      332'
                mem_copy(out_ptr, src_ptr, len); // rare, slow     336'
        } else {
                // fast copy with 16B unaligned copies
                mem_copy_fast_16(out_ptr, src_ptr, len);      334'
        }
                           338'
        out_ptr += len;
        in_ptr = next_ptr;      340'
}
```

FIG. 5

TECHNOLOGIES FOR EFFICIENT LZ77-BASED DATA DECOMPRESSION

CROSS-REFERENCE TO RELATED APPLICATION

The present application is a continuation application of U.S. application Ser. No. 14/494,766, entitled "TECHNOLOGIES FOR EFFICIENT LZ77-BASED DATA DECOMPRESSION," which was filed on Sep. 24, 2014.

BACKGROUND

Software data decompression is an important software operation used in many computing applications, including both server and client applications. Many common lossless compression formats are based on the LZ77 compression algorithm. Data compressed using LZ77-based algorithms typically include a stream of symbols. Each symbol may include literal data that is to be copied to the output or a reference to repeat data that has already been decompressed. Compared to other lossless compression algorithms such as DEFLATE, LZ77-based algorithms typically achieve lower compression levels but provider higher performance, particularly for decompression. One typical LZ77-based format is "Snappy," developed by Google Inc. and used by the Apache Hadoop™ project and others. Other LZ77-based formats include LZO and LZF.

Typical implementations of decompression algorithms include numerous conditional branches used to categorize input symbols. The outcome of those conditional branches is dependent on the input data. Branch prediction hardware for typical processors may have difficulty correctly predicting the outcome of those conditional branches. Branch misprediction penalties may reduce achievable decompression performance.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

FIG. 5 is a pseudocode listing of at least one embodiment of the method of FIGS. 3A and 3B.

DETAILED DESCRIPTION OF THE DRAWINGS

Figure 1:
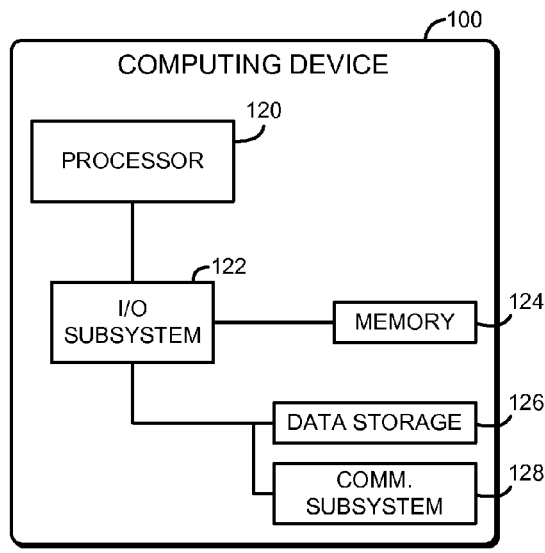
FIG. 1 is a simplified block diagram of at least one embodiment of a computing device for efficient data decompression.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, an illustrative computing device 100 for efficient data decompression includes a processor 120, an I/O subsystem 122, a memory 124, and a data storage device 126. In use, as described below, the computing device 100 is configured to read symbols from compressed input data, decode the symbols, and output decompressed data. The computing device 100 determines whether each input symbol may be decompressed using a fast-path decompression routine or using a traditional slow-path decompression routine. Most symbols may be decompressed using the fast-path routine and thus the determination of whether to apply the fast-path routine may be predicted with high accuracy by branch prediction hardware of the processor 120. During execution of the fast-path routine, the computing device 100 determines the starting address and length of data to be copied without performing data-dependent branch instructions that may be unpredictable using branch prediction hardware. The computing device 100 may use small data tables or other fast techniques to determine the location of the next symbol in the input stream, again without performing data-dependent branch instructions. By avoiding unpredictable branch instructions, the computing device 100 may avoid branch misprediction penalties. By reducing the execution time of a critical instruction path to determine the next symbol location, the computing device 100 may improve throughput, especially when using a processor 120 capable of out-of-order execution. Illustratively, a computing device 100 as described herein may achieve decompression speeds of up to 50-100% faster than previously known, optimized software decompression techniques.

The computing device 100 may be embodied as any type of device capable of efficient data decompression and otherwise performing the functions described herein. For example, the computing device 100 may be embodied as, without limitation, a laptop computer, a notebook computer, a tablet computer, a smartphone, a mobile computing device, a wearable computing device, a computer, a desktop computer, a workstation, a server computer, a distributed computing system, a multiprocessor system, a consumer electronic device, a smart appliance, and/or any other computing device capable of efficient data decompression. As shown in FIG. 1, the illustrative computing device 100 includes the processor 120, the I/O subsystem 122, the memory 124, and the data storage device 126. Of course, the computing device 100 may include other or additional components, such as those commonly found in a computer (e.g., various input/output devices), in other embodiments. Additionally, in some embodiments, one or more of the illustrative components may be incorporated in, or otherwise form a portion of, another component. For example, the memory 124, or portions thereof, may be incorporated in the processor 120 in some embodiments.

The processor 120 may be embodied as any type of processor capable of performing the functions described herein. For example, the processor 120 may be embodied as a single or multi-core processor(s), digital signal processor, microcontroller, or other processor or processing/controlling circuit. Similarly, the memory 124 may be embodied as any type of volatile or non-volatile memory or data storage capable of performing the functions described herein. In operation, the memory 124 may store various data and software used during operation of the computing device 100 such operating systems, applications, programs, libraries, and drivers. The memory 124 is communicatively coupled to the processor 120 via the I/O subsystem 122, which may be embodied as circuitry and/or components to facilitate input/output operations with the processor 120, the memory 124, and other components of the computing device 100. For example, the I/O subsystem 122 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. In some embodiments, the I/O subsystem 122 may form a portion of a system-on-a-chip (SoC) and be incorporated, along with the processor 120, the memory 124, and other components of the computing device 100, on a single integrated circuit chip.

The data storage device 126 may be embodied as any type of device or devices configured for short-term or long-term storage of data such as, for example, memory devices and circuits, memory cards, hard disk drives, solid-state drives, or other data storage devices. The data storage device 126 may store compressed and/or decompressed data processed by the computing device 100.

The computing device 100 may also include a communication subsystem 128, which may be embodied as any communication circuit, device, or collection thereof, capable of enabling communications between the computing device 100 and other remote devices over a computer network (not shown). The communication subsystem 128 may be configured to use any one or more communication technology (e.g., wired or wireless communications) and associated protocols (e.g., Ethernet, Bluetooth®, Wi-Fi®, WiMAX, etc.) to effect such communication.

Figure 2:
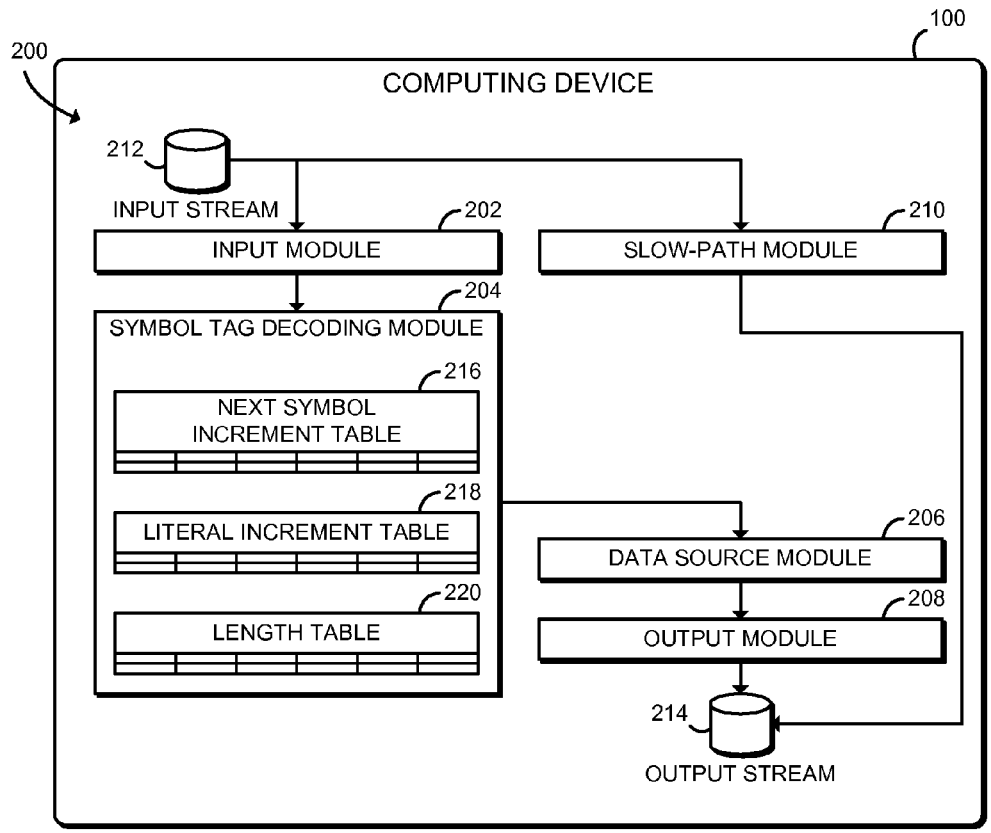
FIG. 2 is a simplified block diagram of at least one embodiment of an environment of the computing device of FIG. 1.

Referring now to FIG. 2, in the illustrative embodiment, the computing device 100 establishes an environment 200 during operation. The illustrative embodiment 200 includes an input module 202, a symbol tag decoding module 204, a data source module 206, an output module 208, and a slow-path module 210. In use, the computing device 100 is configured to read compressed data from an input stream 212, decode the compressed data, and write decompressed data to an output stream 214. The various modules of the environment 200 may be embodied as hardware, firmware, software, or a combination thereof. For example the various modules, logic, and other components of the environment 200 may form a portion of, or otherwise be established by, the processor 120 or other hardware components of the computing device 100.

The input module 202 is configured to manage access to the input stream 212. The input module 202 is configured to open the input stream 212 and read symbols and other data from the input stream 212. The input module 202 may maintain an input stream pointer that may be used to access compressed data from the input stream 212. The input stream 212 may be embodied as any in-memory data structure including compressed data. The input stream 212 may be backed by or otherwise associated with a file, network connection, memory buffer, or any other source of compressed data.

The symbol tag decoding module 204 is configured to determine a next symbol increment value, a literal increment value, a data length, and an offset value based on a symbol tag value read by the input module 202. As described above, the compressed data includes a series of symbols. Each symbol may be a literal symbol or a reference symbol, and each symbol may occupy a variable number of bytes in the input stream 212. Literal symbols include literal data that is to be copied to the output stream 214 during decompression. Reference symbols refer to previously decompressed data that is to be copied to the output stream 214 during decompression, for example by copying data that was previously copied to the output stream 214. The next symbol increment value may be used to identify the location in the input stream 212 of the beginning of the next symbol. The data length indicates how many bytes of data are to be copied, for both literal symbols and reference symbols. The literal increment value may be used to locate the start of literal data in the input stream 212, and the offset value may be used to locate the start of reference data in the output stream 214. In some embodiments, the symbol tag decoding module 204 may be configured to determine the next symbol increment value, the literal increment, and the data length by indexing a next symbol increment table 216, a literal increment table 218, and a length table 220, respectively. Additionally or alternatively, in some embodiments the symbol tag decoding module 204 may be configured to determine those values programmatically.

The data source module 206 is configured to maintain a source pointer used to access data to be copied to the decompressed output. The data source module 206 is configured to set the source pointer to point to literal data from the input stream 212 or to reference previously decompressed data from the output stream 214 based on the type of the current symbol (i.e., a literal symbol or a reference symbol). The data source module 206 is configured to set the source pointer without executing any unpredictable branch instructions, for example by using conditional move instructions.

The output module 208 is configured to manage access to the output stream 214. The output module 208 is configured to open the output stream 214 and write decompressed data to the output stream 214. The output module 208 is also configured to allow copying already-written data from the output stream 214, used to decompress reference symbols. The output module 208 may maintain an output stream pointer that may be used to read and/or write decompressed data from the output stream 214. The output stream 214 may be embodied as any in-memory data structure capable of storing and referencing decompressed data. The output stream 214 may be backed by or otherwise associated with a file, network connection, memory buffer, or any other destination for decompressed data.

The slow-path module 210 is configured to execute a slow-path decompression routine to decode symbols that cannot be decoded by the fast path (i.e., by the input module 202, the symbol tag decoding module 204, the data source module 206, and the output module 208). The slow-path decompression routine may be embodied as any optimized or unoptimized decompression algorithm capable of decoding the symbols that cannot be decoded by the fast path such as, for example, the Snappy decompression library developed by Google Inc. The slow-path decompression routine may include unpredictable branch instructions based on the class of the current symbol, for example.

Figure 3A:
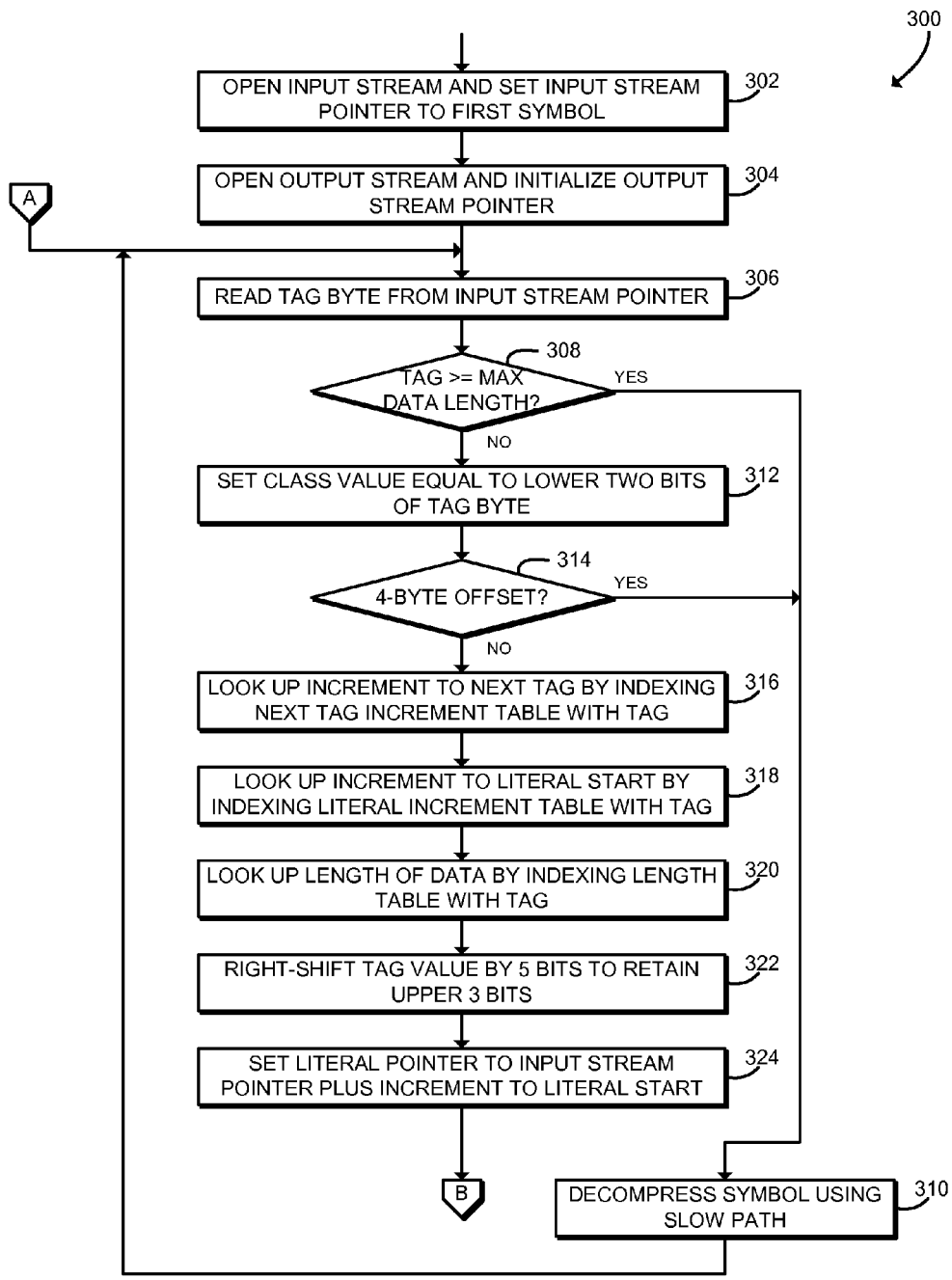
FIGS. 3A and 3B are a simplified flow diagram of at least one embodiment of a method for efficient data decompression that may be executed by the computing device of FIGS. 1 and 2.

Referring now to FIG. 3A, in use, the computing device 100 may execute a method 300 for efficient data decompression. The method 300 begins in block 302, in which the computing device 100 opens the input stream 212 and sets an input stream pointer to the first symbol included in the stream. The computing device 100 may use any technique for opening the input stream 212, such as copying the contents of the file to a memory buffer or memory-mapping a file. For many file formats, the input stream 212 may include a header or other data before the first symbol. For example, the Snappy compressed file format includes a preamble storing the uncompressed length of the file as a little-endian variant. The computing device 100 may perform any appropriate operations to process the header and increment the input stream pointer to the first symbol.

In block 304, the computing device 100 opens the output stream 214 and initializes an output stream pointer. The computing device 100 may use any technique for opening the output stream 214, such as creating an in-memory write buffer or memory-mapping a file. After being opened, the computing device 100 is capable of writing data to the output stream 214 starting at the output stream pointer. The computing device 100 is also capable of reading and/or copying data from the output stream 214, which is used to decompress reference symbols.

In block 306, the computing device 100 reads a tag value for the current input symbol from the input stream pointer. In the illustrative embodiment, which decompresses files stored in the Snappy format, the computing device 100 reads a single tag byte from the input stream 212. However, in other embodiments, the computing device 100 may read additional tag data. As described above, the input stream 212 includes a sequence of symbols, including literal symbols and reference symbols. The tag value may be used by the computing device 100 to determine the type of the current symbol, and may also be used to determine parameters of the symbol such as offset and data length.

Figure 4:
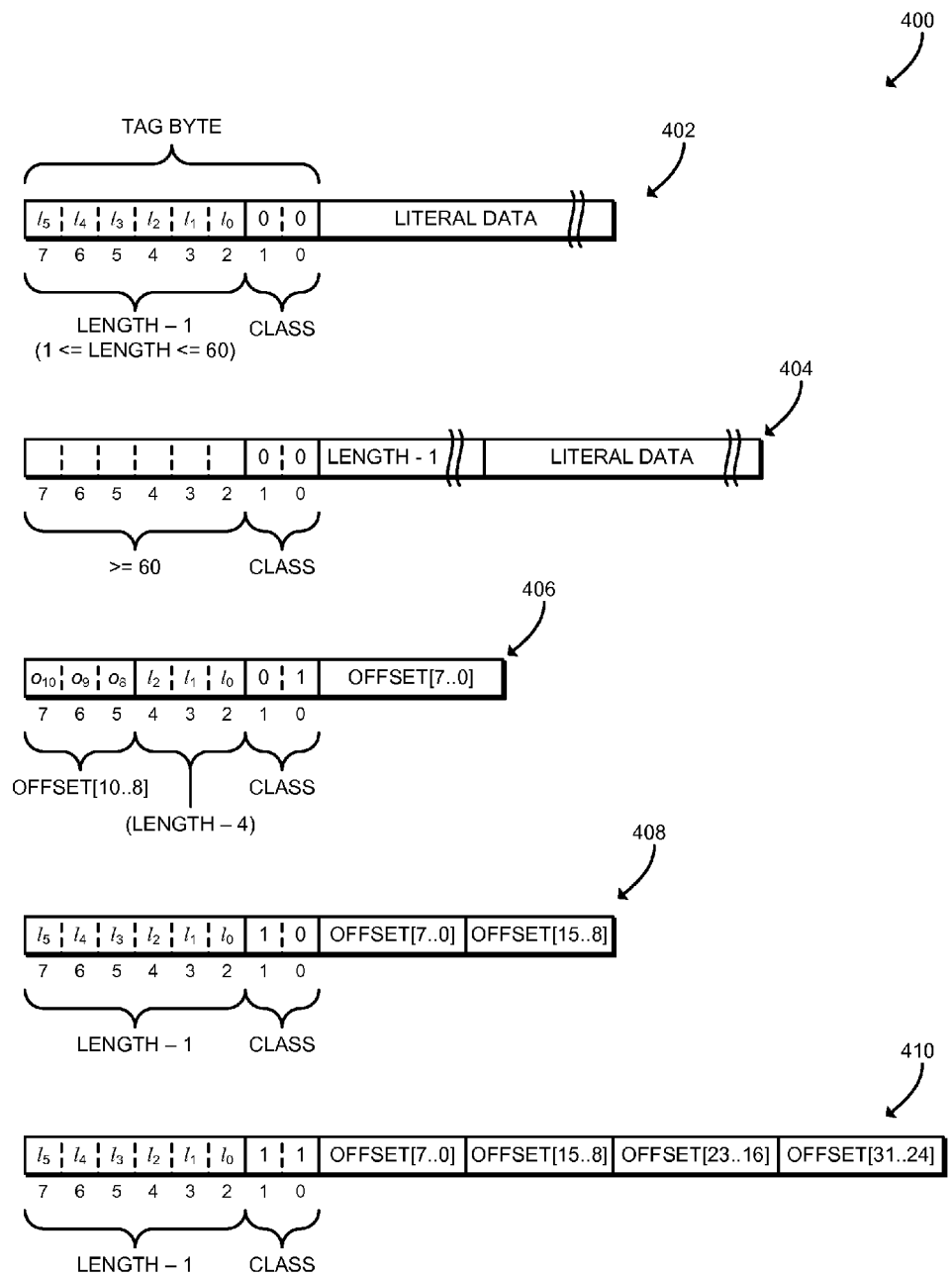
FIG. 4 is a schematic diagram of compressed data symbols that may be decompressed by the method of FIGS. 3A and 3B.

Referring now to FIG. 4, a diagram 400 illustrates various symbols used in the Snappy format. Each symbol begins with a tag byte and includes a two-bit class value in the least-significant two bits of the tag byte that may be used to categorize the symbols. Symbols 402, 404 are literal symbols, with a class value equal to the binary value "00." The symbol 402 includes a tag byte followed by sequence of literal data bytes. The most-significant six bits of the tag byte represent the length of the literal minus one. The symbol 402 may represent literals of lengths from 1 to 60 bytes, inclusive. Thus, the symbol 402 may be used for relatively short literals.

The symbol 404 may be used for longer literals. The symbol 404 includes a tag byte followed by a length value, and then followed by a sequence of literal data bytes. The most-significant six bits of the tag byte are coded to indicate how many bytes are used to store the length value. Binary values corresponding to 60, 61, 62, or 63 correspond to lengths of 1-4 bytes, respectively. The length value is equal to the length of the literal minus one, stored in little-endian format.

Symbols 406, 408, 410 are reference symbols. The symbol 406 is a one-byte offset reference symbol with a class value equal to the binary value "01." The symbol 406 includes an 11-bit offset value. The three most-significant bits of the offset ($o_{10}$ through $o_8$) are stored in the three most-significant bits of the tag byte, and the rest of the offset (bits $o_7$ through $o_0$) is stored in the next byte following the tag byte. The tag byte also includes a three-bit length value positioned between the offset bits and the class bits (bits numbered 4 to 2 of the tag byte, labeled $l_2$ through $l_0$). The length value represents the data length minus four; therefore, the symbol 406 may store lengths from four to 11, inclusive, and offsets from zero to 2047, inclusive.

The symbol 408 is a two-byte offset reference symbol with a class value equal to the binary value "10." The symbol 408 includes a two-byte offset value following the tag byte, stored as a little-endian 16-bit integer. In other words, the first byte of the offset stores the eight least-significant bits and the second byte of the offset stores the eight most-significant bits. The length value is stored in the most-significant six bits of the tag byte, and represents the length of data to be copied minus one. The symbol 408 may store lengths from one to 64, inclusive, and offsets from zero to 65,535, inclusive.

The symbol 408 is a four-byte offset reference symbol with a class value equal to the binary value "11." The symbol 408 includes a four-byte offset value following the tag byte, stored as a little-endian 32-bit integer. The length value is stored in the most-significant six bits of the tag byte, and equals the length of data to be copied minus one. Four-byte offset reference symbols may be very rare in compressed data in use, because generation of such symbols would require compressors to maintain a large amount of history.

Referring back to FIG. 3A, after reading the tag value, in block 308 the computing device 100 determines whether the tag value is greater than a maximum data length. If the tag value is greater than the maximum data length, then the computing device 100 may not be capable of a fast-path decompression of the symbol. In many embodiments, the maximum data length may be 60 bytes, because as described above, if the upper six bits of the tag value are greater than or equal to 60 (because the upper six bits include the length minus one), then the symbol may be a large literal symbol, such as the symbol 404 of FIG. 4. In those embodiments, the computing device 100 may determine whether the upper six bits of the tag byte are greater than or equal to 60, which may be equivalent to determining whether the tag value is greater than or equal to 60 times four. If the computing device 100 determines that the tag value is greater than the maximum data length, the method 300 branches to block 310. If not, the computing device 100 advances to block 312, described below.

In block 310, the computing device 100 decompresses the current input symbol using a slow-path routine. The slow-path routine may perform an ordinary, optimized or unoptimized decompression algorithm. In particular, when executing the slow-path routine, the computing device 100 may perform unpredictable branch instructions or other potentially slow instructions to perform correct decompression of the input symbol. Because the slow-path is rarely taken, overall performance of the method 300 may not be adversely impacted by branch misprediction penalties or other performance issues in the slow-path. When executing the slow-path routine, the computing device 100 may not make assumptions about the type of the current input symbol and thus may check for all potential formats. For example, although the tag byte may have its upper six bits greater than or equal to 60, the current input symbol is not necessarily a long literal symbol. For example, the current symbol may be a two- or four-byte reference symbol having a length greater than 60. After decompressing the current symbol and updating the input stream pointer and the output stream pointer accordingly, the method 300 loops back to block 306 to continue decompressing the next symbol.

Referring back to block 308, if the tag value is not greater than or equal to 60 times four, the method 300 advances to block 312. Because the tag value will only rarely be greater than or equal to 60 times four, in most iterations the method 300 advances to block 312. Therefore, branch prediction hardware of the processor 120 may be capable of predicting whether the method 300 advances to block 312 with high accuracy. In block 312, the computing device 100 sets a class value equal to the lower two bits of the tag byte. The computing device 100 may, for example, mask off the lower two bits using one or more bitwise operations. As shown in FIG. 4, the two-bit class value identifies four different types of symbols: literals, one-byte offset references, two-byte offset references, and four-byte offset references.

In block 314, the computing device 100 determines whether the class of the current symbol is a four-byte offset reference symbol. For example, the computing device 100 may determine whether the class value equals the binary value "11." The computing device 100 may not be capable of a fast-path decompression of four-byte offset reference symbols. If the symbol is a four-byte offset reference symbol, the method 300 branches to block 310 to perform the slow-path decompression routine, as described above. If the symbol is not a four-byte offset reference symbol, the method 300 advances to block 316. As described above, four-byte offset reference symbols are rare. Therefore, in most iterations the method 300 advances to block 316, and branch prediction hardware of the processor 120 may be capable of predicting whether the method 300 advances to block 316 with high accuracy.

In block 316, the computing device 100 looks up the increment value to the next symbol by indexing the next symbol increment table 216 using the tag byte. The next symbol increment table 216 is small (e.g., no more than 256 bytes), and may be capable of being stored in cache memory of the processor 120. Therefore, determination of the next symbol increment value may be completed very quickly (i.e., in the time required for an L1 cache hit, for example four clock cycles). As described below, the next symbol increment value may be added to the input stream pointer to determine the position in the input stream 212 of the next symbol. Thus, the determination of the next symbol increment value may be on the critical path of the method 300. By calculating the next symbol increment value quickly and without depending on any unpredictable branches, the computing device 100 may reduce the length and/or latency of the critical path. In particular, in embodiments having a processor 120 capable of out-of-order instruction execution, the computing device 100 may be capable of continuing out-of-order execution for decompression of additional input symbols. Further, although illustrated as looking the next symbol increment value up from the next symbol increment table 216, it should be understood that in some embodiments the computing device 100 may calculate the next symbol increment value programmatically.

In block 318, the computing device 100 looks up the increment value to the start of a literal symbol by indexing the literal increment table 218 using the tag byte. As illustrated by symbols 402, 404 of FIG. 4, for literal symbols, the increment from the address of tag byte to the start of the literal data may vary between 1-5 bytes, depending on the length of the literal data. Additionally, the literal increment table 218 may include any value for tag bytes associated with reference symbols, because the literal increment value will not be used for those symbols. Similar to the next symbol increment table 216, the literal increment table 218 is small (e.g., no more than 256 bytes), and may be capable of being stored in cache memory of the processor 120. Further, although illustrated as looking the literal increment value up from the literal increment table 218, it should be understood that in some embodiments the computing device 100 may calculate the literal increment value programmatically. Additionally or alternatively, in some embodiments the fast-path decompression routine may only decompress relatively short literals having an offset of one byte. In those embodiments, the literal increment table 218 may include all "ones," or the increment to the start of the literal data may be a constant value of one and the literal increment table 218 may be omitted.

In block 320, the computing device 100 looks up the length of data to be copied by indexing the length table 220 using the tag byte. All of the symbols that may be processed by the fast-path decompression process include a representation of the data length in the tag byte itself. For example, the symbols 402, 406, 408 of FIG. 4 all include the length in the tag byte. The length table 220 may include any value—or no values—for tag bytes that will not be processed by the fast-path routine. Similar to the tables 216, 218, the length table 220 is small (e.g., no more than 256 bytes), and may be capable of being stored in cache memory of the processor 120. Further, although illustrated as looking the data length value up from the length table 220, it should be understood that in some embodiments the computing device 100 may calculate the data length value programmatically.

In block 322, the computing device 100 right-shifts the tag value by five bits, retaining the original upper three bits. Right-shifting the tag value allows the computing device 100 to extract the upper bits of the offset for one-byte reference symbols. As illustrated by symbol 406 of FIG. 4, right-shifting the tag byte by five bits moves the upper three bits of the offset ($o_{10}$ through $o_8$) to the three least-significant bits of the tag byte.

In block 324, the computing device 100 sets a literal pointer to point to the input stream pointer plus the literal increment value determined as described above in block 318. The computing device 100 may set the literal pointer without determining whether the current symbol is a literal symbol or a reference symbol. As described below, the computing device 100 will disregard the literal pointer for reference symbols.

Figure 3B:
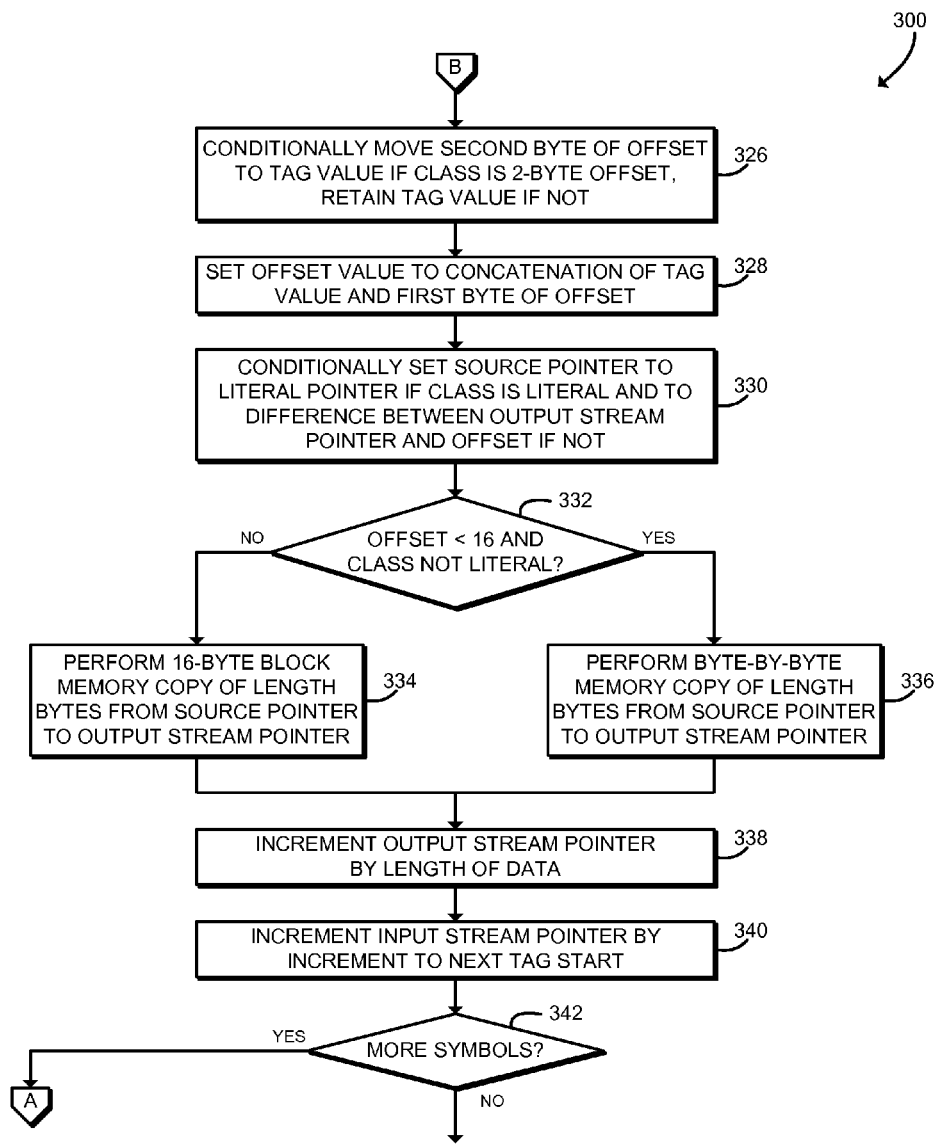

Referring now to FIG. 3B, the method 300 continues with block 326, in which the computing device 100 conditionally moves the second byte of the offset value to the tag value if the symbol is a two-byte offset reference symbol, retaining the tag value if the symbol is not a two-byte offset reference symbol. As illustrated by symbol 408 of FIG. 4, for two-byte offset symbols, the second byte of the offset value includes the eight most-significant bits of the offset value (bits 15 through 8). The computing device 100 may use any technique to conditionally set the tag value without executing a conditional branch instruction. For example the computing device 100 may perform the conditional move using a tertiary operator, predicated instruction, conditional move instruction, or other processor instruction. In the illustrative embodiment, the computing device 100 tests whether the class value matches the binary value "10" and then executes a conditional move (CMOV) instruction based on the results of the test. Performing a conditional move instruction allows the computing device 100 to select the proper value without executing any unpredictable branch instructions and incurring associated branch misprediction penalties.

In block 328, the computing device 100 sets an offset value to the concatenation of the tag value and the first byte of the offset. As described above, the tag value includes either the three most-significant bits of the offset value, as described in connection with block 322 above, or the eight most-significant bits of the offset value, as described in connection with block 326 above. Thus, after concatenation the offset value is correct for both one-byte and two-byte offset symbols. Additionally, as described above, the offset value may have been calculated without executing any unpredictable branch instructions.

In block 330, the computing device 100 conditionally sets a source pointer to the literal pointer if the symbol has a literal class and to the difference between the output stream pointer and the offset value if the symbol does not have a literal class value. The computing device 100 may use any technique to conditionally set the source pointer. For example the computing device 100 may perform the conditional move using a tertiary operator, predicated instruction, conditional move instruction, or other processor instruction. In the illustrative embodiment, the computing device 100 tests whether the class value is the binary value "00," and then executes a conditional move (CMOV) instruction to move either the literal pointer or the difference between the output stream pointer and the offset value based on the results of the test. Performing a conditional move instruction allows the computing device 100 to set the proper value of the source pointer without executing any unpredictable branch instructions and incurring associated branch misprediction penalties. After determining the source pointer, the computing device 100 may copy the data length amount of bytes from the source pointer to the output stream pointer, as further described below. The actual data is thus either copied from the literal data of the input stream 212 or from data previously output to the output stream 214.

In block 332, the computing device 100 determines whether the offset value is less than 16 and whether the class of the symbol is not literal. In some embodiments, the computing device 100 may perform short-circuit logical evaluation of that test. That is, if the offset value is greater than or equal to 16, the computing device 100 may not test the class of the symbol. In many embodiments, the offset value is usually greater than or equal to 16. Thus, the determination of block 332 may be highly predictable using branch prediction hardware of the computing device 100. If the offset value is less than 16 and the class is not literal, the method 332 branches to block 336, described below. If not, the method 300 branches to block 334.

In block 334, the computing device 100 performs a 16-byte block memory copy of the data length number of bytes starting at the source pointer, to the output stream pointer. In many embodiments, the processor 120 of the computing device 100 may be capable of fast 16-byte unaligned memory copies, for example using specialized vector instructions or vector registers. Because the computing device 100 copies 16 bytes of data at a time, more data than the requested data length may be copied to the output stream 214. However, as described below, after completing the copy, that incorrectly copied data will be positioned past the output stream pointer and thus will be overwritten with correct data when additional symbols are decoded. After copying the data, the method 300 advances to block 338, described below.

Referring back to block 332, if the offset value is less than 16 and the class is not literal, the method 332 branches to block 336. In block 336, the computing device 100 performs a byte-by-byte memory copy of data length bytes from the source pointer to the output stream pointer. Performing a byte-by-byte copy may typically be slower than a block copy, but the byte-by-byte copy may be required for correctness and/or to avoid page faults or other errors. After copying the data, the method 300 advances to block 338.

In block 338, the computing device 100 increments the output stream pointer by the length of the data copied to the output stream 214. Thus, the output stream pointer is prepared to write decompressed data for the next symbol at the correct position in the output stream 214. In block 340, the computing device 100 increments the input stream pointer by the next symbol increment value. Thus, the input stream pointer is prepared to read data for the next input symbol at the correct position in the input stream 212.

In block 342, the computing device 100 determines whether additional symbols remain to be decoded. The computing device 100 may use any technique to determine whether additional symbols remain, such as comparing the output stream pointer or the input stream pointer to maximum sizes previously determined based on a header of the compressed file, testing whether an end of file has been reached in the input stream 212, or any other test. If additional symbols remain, the method 300 loops back to block 306 to read the next tag byte, shown in FIG. 3A. If no additional symbols remain, the method 300 is completed. The computing device 100 may close the input stream 212 and/or the output stream 214, output the decompressed content, or perform any other required processing to produce the decompressed output. The method 300 may be restarted at block 302 to perform additional decompression.

Figure 6:
FIG. 6 is a pseudocode listing of another embodiment of part of the method of FIGS. 3A and 3B.

Referring now to FIG. 5, the pseudocode 500 illustrates one potential embodiment of the method 300. As shown, the pseudocode 500 illustrates operations 306' through 340', which each correspond to one illustrative embodiment of blocks 306 through 340 of FIGS. 3A and 3B, respectively. In particular, the pseudocode 500 determines whether to apply the slow-path routine in operations 308' through 314' by performing highly predictable "if" statements that, if true, may jump to the slow-path routine, corresponding to one illustrative embodiment of the blocks 308 through 314. Additionally, the pseudocode 500 conditionally assigns the value of the source pointer in the operation 330', which includes a tertiary operator and corresponds to one illustrative embodiment of block 330. As described above, in many embodiments that tertiary operator may be compiled to executable code including a conditional move instruction such as CMOV. The pseudocode 500 also uses a similar operation 326' including a tertiary operator to conditionally move the second byte of the offset value, corresponding to one illustrative embodiment of the block 326. Referring now to FIG. 6, the pseudocode 600 illustrates operations 326", 328", which each correspond to another illustrative embodiment of the blocks 326, 328 of the method 300, respectively. As shown, the pseudocode 600 also uses a tertiary operator to calculate the offset value, which may compiled to executable code including a conditional move instruction such as CMOV.

EXAMPLES

Illustrative examples of the technologies disclosed herein are provided below. An embodiment of the technologies may include any one or more, and any combination of, the examples described below.

Example 1 includes a computing device for data decompression, the computing device comprising an input module to read a symbol tag value from a memory location identified by an input pointer; a symbol tag decoding module to determine a next symbol increment value, a literal increment value, a data length, and an offset value as a function of the symbol tag value; a data source module to conditionally set a source pointer to (i) the input pointer plus the literal increment value in response to a determination that the symbol tag value includes a literal class value and (ii) to an output pointer minus the offset value in response to a determination that the symbol tag value does not include the literal class value; and an output module to copy data of the data length from a memory location identified by the source pointer to a memory location identified by the output pointer; wherein the input module is further to increment the input pointer by the next symbol increment value in response to copying of the data.

Example 2 includes the subject matter of Example 1, and wherein to conditionally set the source pointer comprises to conditionally set the source pointer without execution of a branch instruction.

Example 3 includes the subject matter of any of Examples 1 and 2, and wherein to conditionally set the source pointer comprises to conditionally set the source pointer with a conditional move instruction.

Example 4 includes the subject matter of any of Examples 1-3, and further including a slow-path module to execute a slow-path decompression routine in response to a determination that a current symbol cannot be fast-path decoded; wherein the symbol tag decoding module is further to determine, as a function of the symbol tag value and prior to a determination of the next symbol increment value, whether the current symbol can be fast-path decoded.

Example 5 includes the subject matter of any of Examples 1-4, and wherein to determine whether the current symbol can be fast-path decoded comprises to determine whether the data length has a predefined relationship with a maximum data length as a function of the symbol tag.

Example 6 includes the subject matter of any of Examples 1-5, and wherein to determine whether the data length has the predefined relationship with the maximum data length comprises to determine whether the data length is greater than sixty bytes.

Example 7 includes the subject matter of any of Examples 1-6, and wherein to determine whether the current symbol can be fast-path decoded comprises to determine whether the symbol tag includes a four-byte offset class value.

Example 8 includes the subject matter of any of Examples 1-7, and wherein to determine the next symbol increment value comprises to index a next symbol increment table with the symbol tag value.

Example 9 includes the subject matter of any of Examples 1-8, and wherein to index the next symbol increment table comprises to look up the next symbol increment value in the next symbol increment table stored in a cache memory of a processor of the computing device.

Example 10 includes the subject matter of any of Examples 1-9, and where to determine the literal increment value comprises to index a literal increment table with the symbol tag value.

Example 11 includes the subject matter of any of Examples 1-10, and wherein to index the literal increment table comprises to look up the literal increment value in the literal increment table stored in a cache memory of a processor of the computing device.

Example 12 includes the subject matter of any of Examples 1-11, and wherein to determine the data length comprises to index a length table with the symbol tag value.

Example 13 includes the subject matter of any of Examples 1-12, and wherein to index the length table comprises to look up the data length in the length table stored in a cache memory of a processor of the computing device.

Example 14 includes the subject matter of any of Examples 1-13, and wherein to read the symbol tag value comprises to read a tag byte from the memory location identified by the input pointer.

Example 15 includes the subject matter of any of Examples 1-14, and wherein to determine the offset value as a function of the symbol tag value comprises to right-shift the tag byte by five bits; conditionally set the tag byte to a second offset byte read from the memory location identified by the input pointer if the symbol tag value includes a two-byte offset class value and to the tag byte if the symbol tag value does not include the two-byte offset class value; and concatenate the tag byte and a first offset byte read from the memory location identified by the input pointer to generate the offset value.

Example 16 includes the subject matter of any of Examples 1-15, and wherein to conditionally set the tag byte comprises to conditionally set the tag byte using a conditional move instruction.

Example 17 includes the subject matter of any of Examples 1-16, and wherein to copy data of the data length from the memory location identified by the source pointer to the memory location identified by the output pointer comprises to determine whether the offset value is less than a predefined block size; determine whether the symbol tag value does not include a literal class value in response to a determination that the offset value is less than the predefined block size; perform a byte-by-byte memory copy of the data length from the memory location identified by the source pointer to the memory location identified by the output pointer in response to a determination that the symbol tag value does not include the literal class value; and perform a block memory copy of the data length using blocks of the predefined block size from the memory location identified by the source pointer to the memory location identified by the output pointer in response to a determination that the offset value is not less than the predefined block size or in response to a determination that the symbol tag value includes the literal class value.

Example 18 includes the subject matter of any of Examples 1-17, and wherein the predefined block size comprises sixteen bytes, thirty-two bytes, or sixty-four bytes.

Example 19 includes the subject matter of any of Examples 1-18, and wherein the output module is further to increment the output pointer by the data length in response to copying of the data.

Example 20 includes the subject matter of any of Examples 1-19, and wherein the input module is further to determine whether additional symbols remain in response to incrementing of the input pointer; and read a next symbol tag value from a memory location identified by the input pointer in response to a determination that additional symbols remain.

Example 21 includes a method for data decompression, the method comprising reading, by a computing device, a symbol tag value from a memory location identified by an input pointer; determining, by the computing device, a next symbol increment value, a literal increment value, a data length, and an offset value as a function of the symbol tag value; conditionally setting, by the computing device, a source pointer to (i) the input pointer plus the literal increment value in response to determining that the symbol tag value includes a literal class value and (ii) to an output pointer minus the offset value in response to determining that the symbol tag value does not include the literal class value; copying, by the computing device, data of the data length from a memory location identified by the source pointer to a memory location identified by the output pointer; and incrementing, by the computing device, the input pointer by the next symbol increment value in response to copying of the data.

Example 22 includes the subject matter of Example 21, and wherein conditionally setting the source pointer comprises conditionally setting the source pointer without executing a branch instruction.

Example 23 includes the subject matter of any of Examples 21 and 22, and wherein conditionally setting the source pointer comprises conditionally setting the source pointer using a conditional move instruction.

Example 24 includes the subject matter of any of Examples 21-23, and further including determining, by the computing device as a function of the symbol tag value and prior to determining the next symbol increment value, whether a current symbol can be fast-path decoded; and executing, by the computing device, a slow-path decompression routine in response to determining the current symbol cannot be fast-path decoded.

Example 25 includes the subject matter of any of Examples 21-24, and wherein determining whether the current symbol can be fast-path decoded comprises determining whether the data length has a predefined relationship with a maximum data length as a function of the symbol tag.

Example 26 includes the subject matter of any of Examples 21-25, and wherein determining whether the data length has the predefined relationship with the maximum data length comprises determining whether the data length is greater than sixty bytes.

Example 27 includes the subject matter of any of Examples 21-26, and wherein determining whether the current symbol can be fast-path decoded comprises determining whether the symbol tag includes a four-byte offset class value.

Example 28 includes the subject matter of any of Examples 21-27, and wherein determining the next symbol increment value comprises indexing a next symbol increment table with the symbol tag value.

Example 29 includes the subject matter of any of Examples 21-28, and wherein indexing the next symbol increment table comprises looking up the next symbol increment value in the next symbol increment table stored in a cache memory of a processor of the computing device.

Example 30 includes the subject matter of any of Examples 21-29, and wherein determining the literal increment value comprises indexing a literal increment table with the symbol tag value.

Example 31 includes the subject matter of any of Examples 21-30, and wherein indexing the literal increment table comprises looking up the literal increment value in the literal increment table stored in a cache memory of a processor of the computing device.

Example 32 includes the subject matter of any of Examples 21-31, and wherein determining the data length comprises indexing a length table with the symbol tag value.

Example 33 includes the subject matter of any of Examples 21-32, and wherein indexing the length table comprises looking up the data length in the length table stored in a cache memory of a processor of the computing device.

Example 34 includes the subject matter of any of Examples 21-33, and wherein reading the symbol tag value comprises reading a tag byte from the memory location identified by the input pointer.

Example 35 includes the subject matter of any of Examples 21-34, and wherein determining the offset value as a function of the symbol tag value comprises right-shifting the tag byte by five bits; conditionally setting the tag byte to a second offset byte read from the memory location identified by the input pointer if the symbol tag value includes a two-byte offset class value and to the tag byte if the symbol tag value does not include the two-byte offset class value; and concatenating the tag byte and a first offset byte read from the memory location identified by the input pointer to generate the offset value.

Example 36 includes the subject matter of any of Examples 21-35, and wherein conditionally setting the tag byte comprises conditionally setting the tag byte using a conditional move instruction.

Example 37 includes the subject matter of any of Examples 21-36, and wherein copying data of the data length from the memory location identified by the source pointer to the memory location identified by the output pointer comprises determining whether the offset value is less than a predefined block size; determining whether the symbol tag value does not include a literal class value in response to determining the offset value is less than the predefined block size; performing a byte-by-byte memory copy of the data length from the memory location identified by the source pointer to the memory location identified by the output pointer in response to determining the symbol tag value does not include the literal class value; and performing a block memory copy of the data length using blocks of the predefined block size from the memory location identified by the source pointer to the memory location identified by the output pointer in response to determining the offset value is not less than the predefined block size or in response to determining the symbol tag value includes the literal class value.

Example 38 includes the subject matter of any of Examples 21-37, and wherein the predefined block size comprises sixteen bytes, thirty-two bytes, or sixty-four bytes.

Example 39 includes the subject matter of any of Examples 21-38, and further including incrementing, by the computing device, the output pointer by the data length in response to copying the data.

Example 40 includes the subject matter of any of Examples 21-39, and further including determining, by the computing device, whether additional symbols remain in response to incrementing the input pointer; and reading, by the computing device, a next symbol tag value from a memory location identified by the input pointer in response to determining additional symbols remain.

Example 41 includes a computing device comprising a processor; and a memory having stored therein a plurality of instructions that when executed by the processor cause the computing device to perform the method of any of Examples 21-40.

Example 42 includes one or more machine readable storage media comprising a plurality of instructions stored thereon that in response to being executed result in a computing device performing the method of any of Examples 21-40.

Example 43 includes a computing device comprising means for performing the method of any of Examples 21-40.

Example 44 includes a computing device for data decompression, the computing device comprising means for reading a symbol tag value from a memory location identified by an input pointer; means for determining a next symbol increment value, a literal increment value, a data length, and an offset value as a function of the symbol tag value; means for conditionally setting a source pointer to (i) the input pointer plus the literal increment value in response to determining that the symbol tag value includes a literal class value and (ii) to an output pointer minus the offset value in response to determining that the symbol tag value does not include the literal class value; means for copying data of the data length from a memory location identified by the source pointer to a memory location identified by the output pointer; and means for incrementing the input pointer by the next symbol increment value in response to copying the data.

Example 45 includes the subject matter of Example 44, and wherein the means for conditionally setting the source pointer comprises means for conditionally setting the source pointer without executing a branch instruction.

Example 46 includes the subject matter of any of Examples 44 and 45, and wherein the means for conditionally setting the source pointer comprises means for conditionally setting the source pointer using a conditional move instruction.

Example 47 includes the subject matter of any of Examples 44-46, and further including means for determining, as a function of the symbol tag value and prior to determining the next symbol increment value, whether a current symbol can be fast-path decoded; and means for executing a slow-path decompression routine in response to determining the current symbol cannot be fast-path decoded.

Example 48 includes the subject matter of any of Examples 44-47, and wherein the means for determining whether the current symbol can be fast-path decoded comprises means for determining whether the data length has a predefined relationship with a maximum data length as a function of the symbol tag.

Example 49 includes the subject matter of any of Examples 44-48, and wherein the means for determining whether the data length has the predefined relationship with the maximum data length comprises means for determining whether the data length is greater than sixty bytes.

Example 50 includes the subject matter of any of Examples 44-49, and, wherein the means for determining whether the current symbol can be fast-path decoded comprises means for determining whether the symbol tag includes a four-byte offset class value.

Example 51 includes the subject matter of any of Examples 44-50, and wherein the means for determining the next symbol increment value comprises means for indexing a next symbol increment table with the symbol tag value.

Example 52 includes the subject matter of any of Examples 44-51, and wherein the means for indexing the next symbol increment table comprises means for looking up the next symbol increment value in the next symbol increment table stored in a cache memory of a processor of the computing device.

Example 53 includes the subject matter of any of Examples 44-52, and wherein the means for determining the literal increment value comprises means for indexing a literal increment table with the symbol tag value.

Example 54 includes the subject matter of any of Examples 44-53, and wherein the means for indexing the literal increment table comprises means for looking up the literal increment value in the literal increment table stored in a cache memory of a processor of the computing device.

Example 55 includes the subject matter of any of Examples 44-54, and wherein the means for determining the data length comprises means for indexing a length table with the symbol tag value.

Example 56 includes the subject matter of any of Examples 44-55, and wherein the means for indexing the length table comprises means for looking up the data length in the length table stored in a cache memory of a processor of the computing device.

Example 57 includes the subject matter of any of Examples 44-56, and wherein the means for reading the symbol tag value comprises means for reading a tag byte from the memory location identified by the input pointer.

Example 58 includes the subject matter of any of Examples 44-57, and wherein the means for determining the offset value as a function of the symbol tag value comprises means for right-shifting the tag byte by five bits; means for conditionally setting the tag byte to a second offset byte read from the memory location identified by the input pointer if the symbol tag value includes a two-byte offset class value and to the tag byte if the symbol tag value does not include the two-byte offset class value; and means for concatenating the tag byte and a first offset byte read from the memory location identified by the input pointer to generate the offset value.

Example 59 includes the subject matter of any of Examples 44-58, and wherein the means for conditionally setting the tag byte comprises means for conditionally setting the tag byte using a conditional move instruction.

Example 60 includes the subject matter of any of Examples 44-59, and wherein the means for copying data of the data length from the memory location identified by the source pointer to the memory location identified by the output pointer comprises means for determining whether the offset value is less than a predefined block size; means for determining whether the symbol tag value does not include a literal class value in response to determining the offset value is less than the predefined block size; means for performing a byte-by-byte memory copy of the data length from the memory location identified by the source pointer to the memory location identified by the output pointer in response to determining the symbol tag value does not include the literal class value; and means for performing a block memory copy of the data length using blocks of the predefined block size from the memory location identified by the source pointer to the memory location identified by the output pointer in response to determining the offset value is not less than the predefined block size or in response to determining the symbol tag value includes the literal class value.

Example 61 includes the subject matter of any of Examples 44-60, and wherein the predefined block size comprises sixteen bytes, thirty-two bytes, or sixty-four bytes.

Example 62 includes the subject matter of any of Examples 44-61, and further including means for incrementing the output pointer by the data length in response to copying the data.

Example 63 includes the subject matter of any of Examples 44-62, and further including means for determining whether additional symbols remain in response to incrementing the input pointer; and means for reading a next symbol tag value from a memory location identified by the input pointer in response to determining additional symbols remain.

The invention claimed is:

1. An Internet-of-Things gateway device for data decompression, the gateway device comprising:
    an input module to read a symbol tag value from a memory location identified by an input pointer;
    a symbol tag decoding module to determine a next symbol increment value, a literal increment value, a data length, and an offset value as a function of the symbol tag value;
    a data source module to conditionally set a source pointer to (i) the input pointer plus the literal increment value in response to a determination that the symbol tag value includes a literal class value and (ii) to an output pointer minus the offset value in response to a determination that the symbol tag value does not include the literal class value; and
    an output module to copy data of the data length from a memory location identified by the source pointer to a memory location identified by the output pointer;
    wherein the input module is further to increment the input pointer by the next symbol increment value in response to copying of the data.

2. The gateway device of claim 1, wherein to conditionally set the source pointer comprises to conditionally set the source pointer without execution of a branch instruction.

3. The gateway device of claim 2, wherein to conditionally set the source pointer comprises to conditionally set the source pointer with a conditional move instruction.

4. The gateway device of claim 1, further comprising:
    a slow-path module to execute a slow-path decompression routine in response to a determination that a current symbol cannot be fast-path decoded;
    wherein the symbol tag decoding module is further to determine, as a function of the symbol tag value and prior to a determination of the next symbol increment value, whether the current symbol can be fast-path decoded.

5. The gateway device of claim 4, wherein to determine whether the current symbol can be fast-path decoded comprises to:
    determine whether the data length has a predefined relationship with a maximum data length as a function of the symbol tag, wherein to determine whether the data length has the predefined relationship with the maximum data length comprises to determine whether the data length is greater than sixty bytes; and
    determine whether the symbol tag includes a four-byte offset class value.

6. The gateway device of claim 1, wherein to determine the next symbol increment value comprises to index a next symbol increment table with the symbol tag value, wherein to index the next symbol increment table comprises to look up the next symbol increment value in the next symbol increment table stored in a cache memory of a processor of the gateway device.

7. The gateway device of claim 1, where to determine the literal increment value comprises to index a literal increment table with the symbol tag value, wherein to index the literal increment table comprises to look up the literal increment value in the literal increment table stored in a cache memory of a processor of the gateway device.

8. The gateway device of claim 1, wherein to determine the data length comprises to index a length table with the symbol tag value, wherein to index the length table comprises to look up the data length in the length table stored in a cache memory of a processor of the gateway device.

9. The gateway device of claim 1, wherein:
    to read the symbol tag value comprises to read a tag byte from the memory location identified by the input pointer; and
    to determine the offset value as a function of the symbol tag value comprises to:
        right-shift the tag byte by five bits;
        conditionally set the tag byte to a second offset byte read from the memory location identified by the input pointer if the symbol tag value includes a two-byte offset class value and to the tag byte if the symbol tag value does not include the two-byte offset class value; and
        concatenate the tag byte and a first offset byte read from the memory location identified by the input pointer to generate the offset value.

10. A method for data decompression, the method comprising:
    reading, by an Internet-of-Things gateway device, a symbol tag value from a memory location identified by an input pointer;
    determining, by the gateway device, a next symbol increment value, a literal increment value, a data length, and an offset value as a function of the symbol tag value;
    conditionally setting, by the gateway device, a source pointer to (i) the input pointer plus the literal increment value in response to determining that the symbol tag value includes a literal class value and (ii) to an output pointer minus the offset value in response to determining that the symbol tag value does not include the literal class value;
    copying, by the gateway device, data of the data length from a memory location identified by the source pointer to a memory location identified by the output pointer; and incrementing, by the gateway device, the input pointer by the next symbol increment value in response to copying the data.

11. The method of claim 10, wherein conditionally setting the source pointer comprises conditionally setting the source pointer without executing a branch instruction.

12. The method of claim 11, wherein conditionally setting the source pointer comprises conditionally setting the source pointer using a conditional move instruction.

13. The method of claim 10, further comprising:
determining, by the gateway device as a function of the symbol tag value and prior to determining the next symbol increment value, whether a current symbol can be fast-path decoded; and
executing, by the gateway device, a slow-path decompression routine in response to determining the current symbol cannot be fast-path decoded.

14. The method of claim 10, wherein:
reading the symbol tag value comprises reading a tag byte from the memory location identified by the input pointer; and
determining the offset value as a function of the symbol tag value comprises:
right-shifting the tag byte by five bits;
conditionally setting the tag byte to a second offset byte read from the memory location identified by the input pointer if the symbol tag value includes a two-byte offset class value and to the tag byte if the symbol tag value does not include the two-byte offset class value; and
concatenating the tag byte and a first offset byte read from the memory location identified by the input pointer to generate the offset value.

15. The method of claim 14, wherein conditionally setting the tag byte comprises conditionally setting the tag byte using a conditional move instruction.

16. The method of claim 10, wherein copying data of the data length from the memory location identified by the source pointer to the memory location identified by the output pointer comprises:
determining whether the offset value is less than sixteen;
determining whether the symbol tag value does not include a literal class value in response to determining the offset value is less than sixteen;
performing a byte-by-byte memory copy of the data length from the memory location identified by the source pointer to the memory location identified by the output pointer in response to determining the symbol tag value does not include the literal class value; and
performing a sixteen-byte block memory copy of the data length from the memory location identified by the source pointer to the memory location identified by the output pointer in response to determining the offset value is not less than sixteen or in response to determining the symbol tag value includes the literal class value.

17. One or more non-transitory, computer-readable storage media comprising a plurality of instructions that in response to being executed cause an Internet-of-Things gateway device to:
read a symbol tag value from a memory location identified by an input pointer;
determine a next symbol increment value, a literal increment value, a data length, and an offset value as a function of the symbol tag value;
conditionally set a source pointer to (i) the input pointer plus the literal increment value in response to determining that the symbol tag value includes a literal class value and (ii) to an output pointer minus the offset value in response to determining that the symbol tag value does not include the literal class value;
copy data of the data length from a memory location identified by the source pointer to a memory location identified by the output pointer; and
increment the input pointer by the next symbol increment value in response to copying the data.

18. The one or more non-transitory, computer-readable storage media of claim 17, wherein to conditionally set the source pointer comprises to conditionally set the source pointer without executing a branch instruction.

19. The gateway device of claim 1, further comprising a first communication interface and a second communication interface.

20. The gateway device of claim 19, wherein the first communication interface is coupled to a plurality of connected edge devices and wherein the second communication interface is coupled to a cloud network.

\* \* \* \* \*